US008652583B2

United States Patent
Wacquez et al.

(10) Patent No.: US 8,652,583 B2
(45) Date of Patent: Feb. 18, 2014

(54) METHOD FOR PRODUCING A THREE-DIMENSIONALLY CONTROLLED SURFACE COATING IN A CAVITY

(75) Inventors: Romain Wacquez, Grenoble (FR); Christophe Constancias, Sarcenas (FR); Philippe Coronel, Barraux (FR)

(73) Assignee: Commissariat a l'Energie Atomique et aux Energies Alternative, Paris (FR)

( * ) Notice: Subject to any disclaimer, the term of this patent is extended or adjusted under 35 U.S.C. 154(b) by 670 days.

(21) Appl. No.: 12/965,063

(22) Filed: Dec. 10, 2010

(65) Prior Publication Data

US 2011/0143050 A1 Jun. 16, 2011

(30) Foreign Application Priority Data

Dec. 10, 2009 (FR) ...................................... 09 05975

(51) Int. Cl.
*B05D 3/00* (2006.01)
(52) U.S. Cl.
USPC ............................ 427/532; 430/320; 430/396
(58) Field of Classification Search
USPC .................................. 427/532; 430/320, 396
See application file for complete search history.

(56) References Cited

U.S. PATENT DOCUMENTS

| 7,172,978 | B2 * | 2/2007 | Liao et al. ...................... 438/780 |
| 7,733,552 | B2 * | 6/2010 | Londergan et al. ........... 359/237 |
| 8,110,460 | B2 * | 2/2012 | Wacquez et al. .............. 438/200 |
| 2004/0131957 | A1 * | 7/2004 | Kubota et al. ................... 430/15 |
| 2004/0265182 | A1 * | 12/2004 | Chen et al. .................... 422/100 |
| 2007/0155159 | A1 * | 7/2007 | Coronel et al. ............... 438/619 |

FOREIGN PATENT DOCUMENTS

JP  A-2007-156384  6/2007
WO  WO 03/096368 A1  11/2003

* cited by examiner

*Primary Examiner* — Michael Cleveland
*Assistant Examiner* — Sarah R Anderson
(74) *Attorney, Agent, or Firm* — Oliff PLC

(57) ABSTRACT

The cavity has first and second main walls covered by a photoresist. The photoresist is subjected to electronic or electromagnetic radiation of wavelength comprised between 12.5 nm and 15 nm. A first thickness of the photoresist is exposed to form a first area of sacrificial material and a second area of different nature defining the surface coating. The sacrificial material is removed, the surface coating is formed and has a surface against one of the main walls and a free opposite surface. The lateral dimensions of the surface coating are defined in the cavity by the radiation through the first main wall.

12 Claims, 7 Drawing Sheets

METHOD FOR PRODUCING A THREE-DIMENSIONALLY CONTROLLED SURFACE COATING IN A CAVITY

BACKGROUND OF THE INVENTION

The invention relates to a method for forming a cavity having opposite first and second main walls, one of the main walls being partially covered by a surface coating of submicronic size having one free surface.

STATE OF THE ART

In the microelectronics and nanoelectronics industry field, the devices produced use very specific properties of the materials that form them. The surface and volume properties condition the possibility of obtaining a device which either complies or not with predefined requirements. It is therefore important to have perfect dimensional control of the different constituent elements of the devices and perfect mastery of the surface or volume properties of the materials used. Choosing the surface coating layers which enable a part of the used surface to be specialized or protected is then of prime importance.

In order to continue the race for enhanced performance, increasingly smaller devices have to be made available. To obtain devices complying with increasingly stringent requirements, the materials have to be able to be located precisely on the surface of the substrate and their position, thickness and lateral dimensions be mastered. To be efficient however, these surface coatings have to be perfectly controlled in so far as position and dimensions are concerned (alignment and self-alignment).

In order to be able to continue the race towards miniaturization and specialization, it is becoming important to be able to define these layers with particular properties on the surface of a substrate, but also in cavities or areas that are difficult to access.

The surface coating, which has become an element of prime importance, is formed at the same time as the device at a moment in the process where it is easy to define the surface coating and when the latter will no longer be liable to be damaged by the subsequent steps. The surface coating is formed at the same time as the cavity or before the cavity of the device, since afterwards it is no longer possible to achieve exact localization and definition of the surface coating dimensions.

The surface coating is conventionally formed on the visible surface of the substrate at the location of the future cavity, or in a variant the surface coating is made on an appended film which is subsequently transferred to perform sealing of the cavity.

These processes are difficult to implement. Fabrication methods have to be used that are more complicated with large physico-chemical constraints between the materials. Different 'tricks' have to be used to be able to begin formation of the cavity while at the same time being capable of forming a surface coating in a particular area which will not be eliminated or damaged by a subsequent step. It is also difficult to achieve high integration densities, as the complexity of the production method goes hand in hand with increased safety margins both at photolithography level and in the thicknesses of the layers used.

Furthermore, the surface coating being formed at the same time as or before the cavity and therefore before formation of the top wall, it is difficult or even impossible to correct the variations of the production method, which result for example in a height difference in the cavity or in a positional offset and therefore in a discrepancy in final operation of the device.

OBJECT OF THE INVENTION

The object of the invention is to provide a process enabling a surface coating to be located easily and perfect dimensional control of the surface coating area to be achieved.

The method according to the invention is characterized in that it comprises:
- formation of the cavity with its two main walls covered by a photoresist,
- exposure of a first thickness of the photoresist by radiation through the first main wall to form a first sacrificial material area and a second area of different nature in the photoresist, one of the first and second areas defining the surface coating,
- removal of the sacrificial material,
- formation of the surface coating against one of the main walls.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
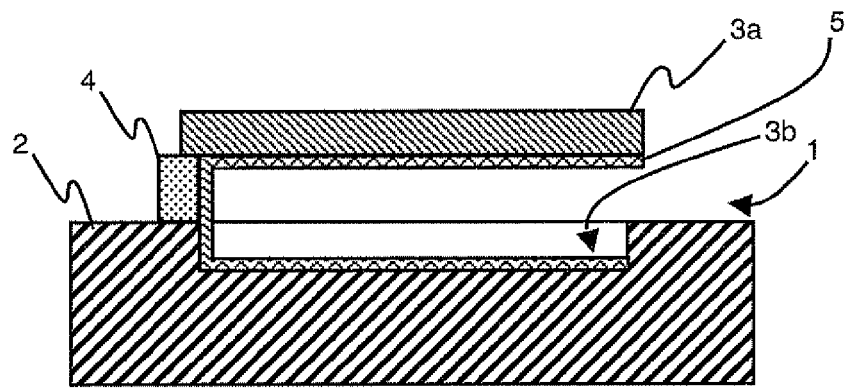
FIGS. 1 to 3 schematically represent cross-sections of a cavity covered by or filled with a photoresist according to different embodiments of the invention, FIG. 4 schematically represents a cross-section of a cavity filled with a photoresist and with a filling material according to the invention, FIGS. 5 and 6 schematically represent cross-sections of exposure of the photoresist in the cavity according to the invention, FIGS. 7 to 19 schematically represent cross-sections of different steps for locating the surface coating in the cavity according to different embodiments of the invention.

As illustrated in FIG. 1, a cavity 1 is formed in a substrate 2. Cavity 1 is delineated at least by two opposite main walls 3, a first main wall 3a and a second main wall 3b. First main wall 3a and second main wall 3b are separated by a predefined distance, the height, this distance being able to vary over the whole surface of cavity 1. The height of cavity 1 can therefore vary at any point according to the shapes of first 3a and second 3b main walls and their respective orientations. First 3a and second 3b main walls are advantageously flat but they can present a surface topography, i.e. a difference of level between different areas, for example surface maskwork or a thickness difference.

First main wall 3a is kept at a distance from second main wall 3b by any suitable means, for example by the use of one or more side walls 4 or by means of a support arm. First main wall 3a can be mobile with respect to second main wall 3b or vice-versa. Cavity 1 can be an open cavity, i.e. a cavity 1 that presents an access area to the volume arranged between the two opposite main walls 3, or it can be a closed cavity in which there is no access to the volume arranged between the opposite main walls 3.

Figure 2:
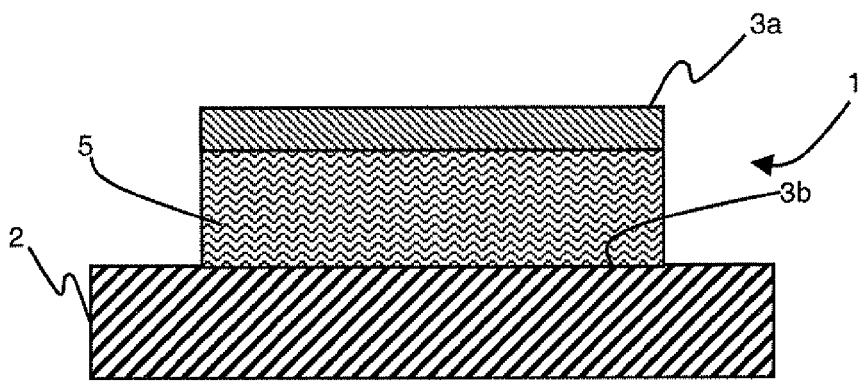

As illustrated in FIG. 2, cavity 1 can therefore be a completely open cavity in which lateral delineation of cavity 1 is achieved by means of the surface of first main wall 3a. In this case, the volume of the cavity is defined with respect to the design of first main wall 3a, and there are no physical side walls delineating the volume of cavity 1. Cavity 1 therefore represents the free volume which is located between the two main walls 3a and 3b.

Cavity 1 can also be a partially open cavity (FIG. 1) in which lateral delineation of cavity 1 is achieved by means of the surface of first main wall 3a and of at least one side wall 4. In a partially open cavity 1, it is possible to have a physical lateral delineation of cavity 1 by means of side walls 4 and access to the volume of cavity 1 by means of an opening formed in first main wall 3a, second main wall 3b or by means of a side wall 4 that is absent or perforated.

Figure 3:
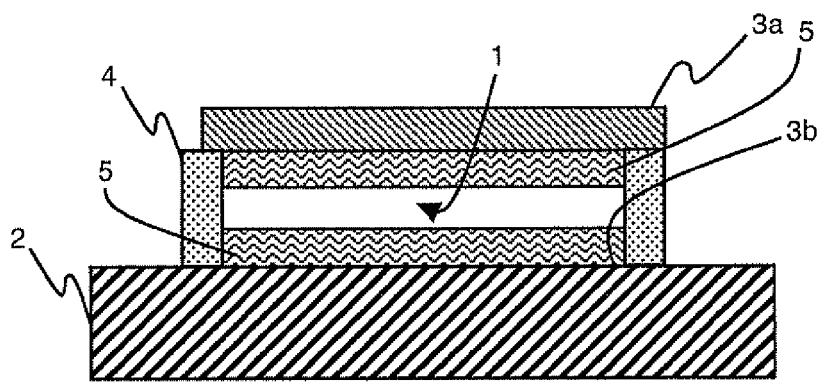

As illustrated in FIG. 3, it is also conceivable to have a completely closed cavity 1, i.e. a cavity the inner volume whereof cannot be accessed.

Cavity 1 is obtained by any suitable means. The height of cavity 1 is comprised in a range extending from a few nanometers to a few hundred micrometers, preferably between 50 and 100 µm to avoid mechanical strength problems. The same is true of the lateral dimensions of cavity 1 which can exceptionally extend up to a few tens of micrometers. Cavity 1 advantageously presents nanometric or sub-micrometric dimensions, which means that the width and length of cavity 1 are comprised in a range extending from a few nanometers to one micrometer. The distance separating the opposite main walls 3 is typically comprised between 10 and 50 nm. First main wall 3a of the cavity can be of any shape, for example square, rectangular, round or oval.

The walls of cavity 1 are covered by a photoresist layer 5. In the case of a completely or partially open cavity 1, it is advantageous to deposit photoresist 5 via the openings of cavity 1 so as to cover at least main walls 3 of cavity 1. Depending on the deposition techniques used and the openings present, photoresist 5 can be deposited on walls 3, 4 of cavity 1 only and a void volume be left in cavity 1, or in another case, photoresist 5 can completely fill the whole volume of cavity 1.

Typically, if photoresist 5 is deposited by a spin-coating technique, photoresist 5 fills the whole volume of cavity 1. In the case where photoresist 5 is deposited by a chemical vapor deposition technique, photoresist 5 is deposited on the walls of the cavity and, depending on the thickness deposited, it can leave a part of the volume of the cavity free or fill cavity 1. If photoresist 5 has to be deposited on the main walls of the cavity with a small thickness, i.e. a thickness such that cavity 1 is not filled by photoresist 5, it is advantageous to deposit photoresist 5 by a chemical vapor deposition technique.

Figure 4:
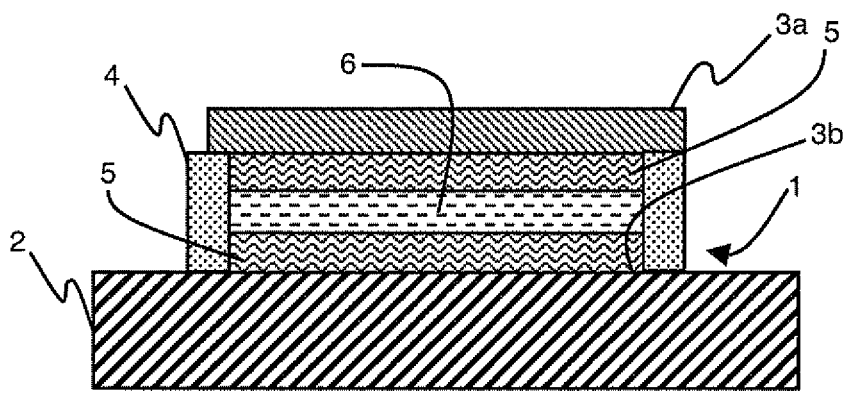

After deposition of photoresist 5, if a void exists in cavity 1, the latter can be left void or be filled by means of a filling material 6, illustrated in FIG. 4, having different physico-chemical properties from those of photoresist 5. Typically, filling material 6 is not reactive to the subsequently used radiation and it can be removed selectively with respect to photoresist 5. Filling material 6 is for example a material deposited in conformal manner and flowable at low temperature, typically an insulating or conducting ink.

If cavity 1 is a closed cavity (FIGS. 3, 4 and 6), photoresist 5 was deposited at the same time as formation of cavity 1. Photoresist 5 was for example deposited in a groove or a hole that was subsequently covered by one of main walls 3. In this instance, photoresist 5 covers main walls 3 of cavity 1 well, as the walls were formed on the pattern of photoresist 5. A multilayer can exist in cavity 1 in which at least two layers of photoresist 5 are separated by a filling material 6 (FIG. 4).

Figure 5:
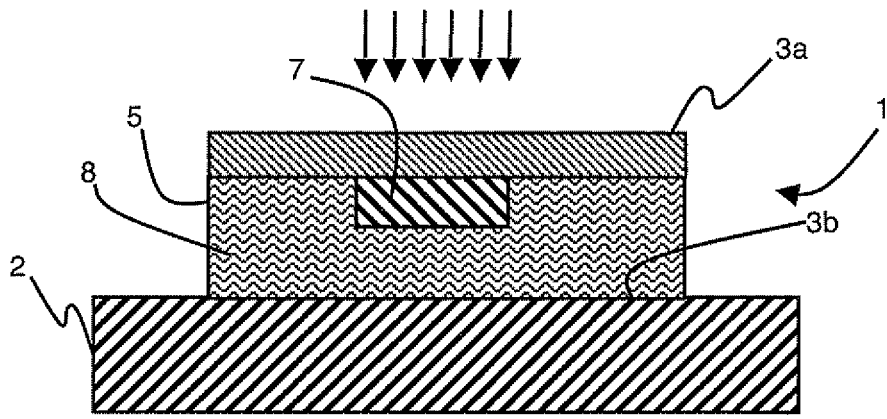

As illustrated in FIG. 5, once cavity 1 has been formed with its main walls 3 covered by photoresist 5, cavity 1 and photoresist 5 are subjected to electronic radiation or to electromagnetic radiation to make a part of the volume of photoresist 5 arranged in cavity 1 react. Exposure of photoresist 5 is performed by means of low-energy electronic radiation or by means of electromagnetic radiation with a wavelength comprised between 0.1 nm and 40 nm and preferably between 12.5 nm and 15 nm in order to be able to work easily for example with silicon-base materials. If the cavity has a height of less than 500 nm, the electronic radiation preferably has an energy comprised between 0.1 and 10 keV. If the cavity has a greater height, the energy is increased and for a cavity having a height of about 10 µm, an energy of about 100 keV is required. This type of radiation enables patterns of nanometric size, typically about ten nanometers, and also patterns of about a hundred nanometers, to be defined laterally. Radiation enables patterns of sub-nanometric size that match the dimensions of cavity 1 to be formed in photoresist 5.

In order to specialize the inner surface of cavity 1, only a part of photoresist 5 is exposed i.e. transformed into a different material. In this way, different portions having different electrical, optical, physico-chemical and/or mechanical properties exist in cavity 1. It is this difference of properties between the two areas of cavity 1 that is subsequently directly or indirectly used by the device. Only a predefined volume of photoresist 5 is transformed.

The materials constituting photoresist 5 are chosen such as to react with the incident radiation thereby achieving partial exposure of photoresist 5. The photoresist is therefore made from a material sensitive to electronic radiation or to electromagnetic radiation having a wavelength comprised between 12.5 nm and 15 nm. The photoresist is for example made from hydrogen silsesquloxane (HSQ) or from polymethyl methacrylate PMMA or it is organometallic-based, for example a resin marketed by the CEIMIG Corporation and which gives a stable metallic material such as gold or platinum, or a metal oxide such as $Al_2O_3$, ZnO, and $TiO_2$ and a mixed metal oxide whose base is BaTiO3, indium-tin oxide or lead zirconate titanate (PZT).

To perform exposure of photoresist 5 through first main wall 3a of the cavity, it is necessary for the material or materials constituting first main wall 3a of the cavity to be transparent or at least partly transparent to the radiation used. The materials forming first main wall 3a and the operating conditions of the incident radiation are chosen to obtain exposure of a first thickness of at least a part of photoresist 5 arranged in the cavity through first main wall 3a. This first thickness of exposed photoresist is smaller than the height of the cavity, smaller than the distance between first and second main wall along propagation of the radiation in the cavity.

Figure 6:
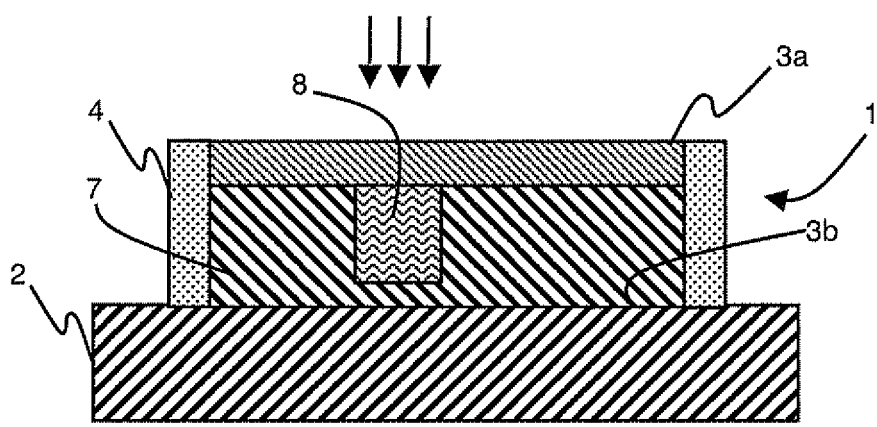

As illustrated in FIGS. 5 and 6, when exposure of photoresist 5 takes place (symbolized by arrows in the figures) and according to the polarity of the photoresist used, the latter is transformed either into a sacrificial material 7 (FIG. 5) or into a stable material 8, i.e. a material that presents another nature than sacrificial material 7. Depending on the embodiments, stable material 8 will delineate or form surface coating 9. The radiation thereby defines, in photoresist 5, at least a first area of sacrificial material 7 and a second area of different nature 8 which can be kept, transformed or subsequently removed. One of the first and second zones enables surface coating 9 to be defined, i.e. enables three-dimensional delineation of surface coating 9 in the cavity to be performed. The exposure then forms first and second zones and at least one of these first and second zones has a thickness equal to the first exposure thickness, i.e. the first transformed thickness of photoresist 5.

Exposure of photoresist 5 enables a sacrificial material 7 and a stable material 8 to be defined whether the photoresist be of negative or positive polarity. According to the polarity of the photoresist used, only the exposure effect changes forming either sacrificial material 7 or stable material 8 in the exposed zone. In the embodiment illustrated in FIG. 5, exposure of photoresist 5 modifies its structure whereas this is not the case in FIG. 6.

Figure 7:
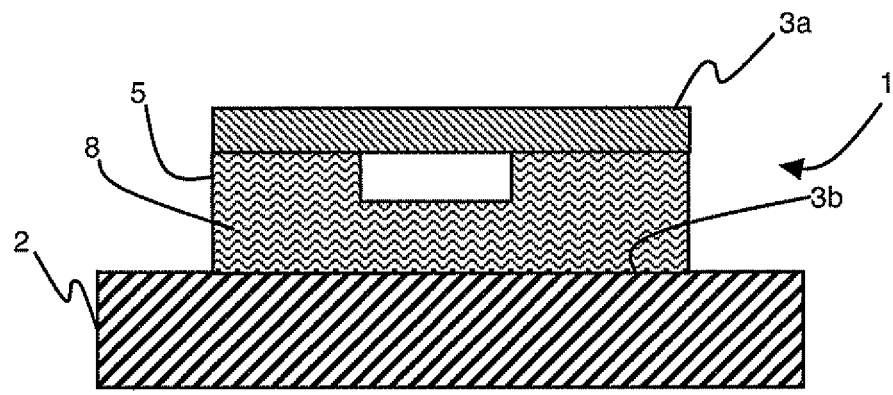
Figure 8:
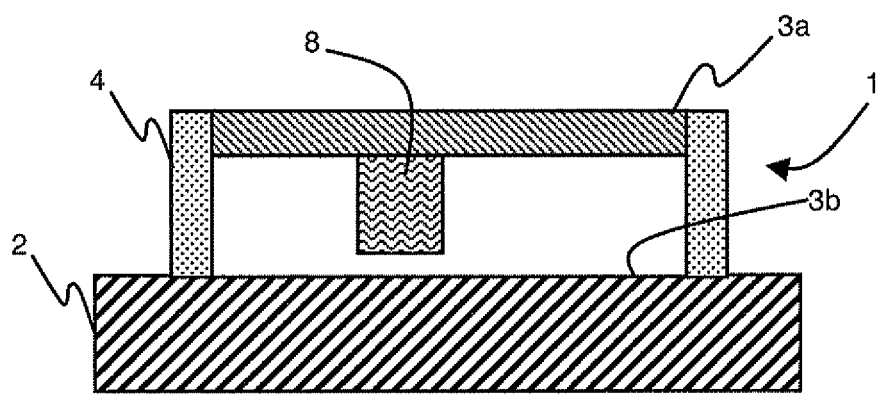

As illustrated in FIGS. 7 and 8, once exposure has been performed, sacrificial material 7 is removed. Removal is performed by any suitable technique and removal of sacrificial material 7 is performed through the opening or openings that exist in the cavity. If cavity 1 is a closed cavity, it is advantageous to form at least one opening to perform removal of the sacrificial material. It is also possible, depending on the methods and materials used, to perform removal of the sacrificial material through one of the walls of the cavity even if no opening exists. After removal of sacrificial material 7, surface coating 9 is formed and cavity 1 can then be left as-is or it can be modified to form a closed cavity or a completely or partially open cavity. The embodiments illustrated in FIGS. 7 and 8 can come from prior steps respectively illustrated in FIGS. 5 and 6.

Once the sacrificial material has been removed, only a part of photoresist 5 (stable material 8) remains, which delineates the surface coating. Stable material 8 delineates surface coating 9 which is in contact with one of main walls 3 on a first surface whereas the opposite second face is free.

This free surface can be used for its surface or volume properties and/or to reduce the effective distance that separates first 3a and second 3b main walls.

Figure 9:
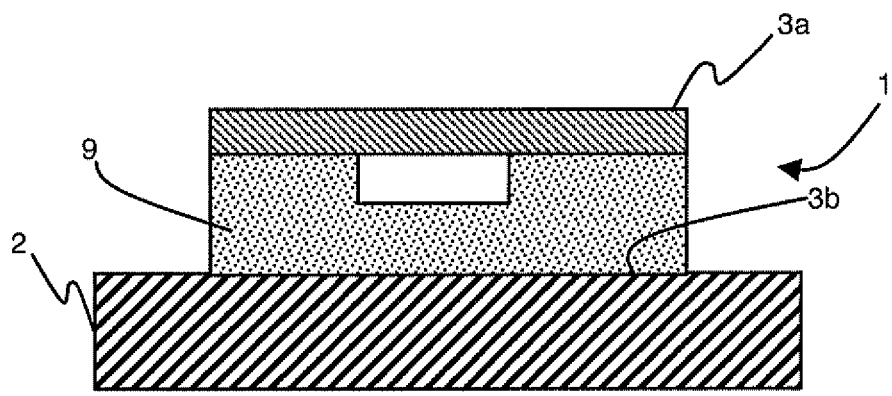
Figure 10:
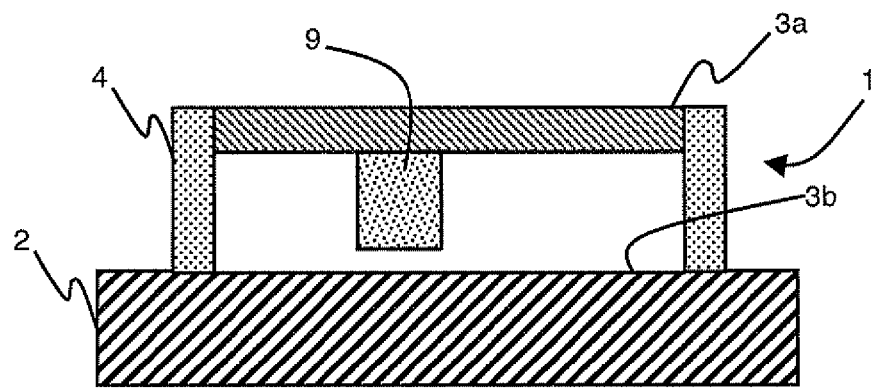

In a particular embodiment illustrated in FIGS. 9 and 10, stable material 8 forms the material of surface coating 9 directly after removal of sacrificial material 7, and the zone of surface coating 9 is directly defined in its dimensions by the radiation used. Surface coating 9 is achieved by stable material 8 which means that the technological steps can be limited.

In another alternative embodiment also illustrated in FIGS. 9 and 10, stable material 8 forms surface coating 9 after undergoing an additional heat treatment or plasma treatment step, for example transformation of the HSQ (hydrogen silsesquioxane) photoresist into a silicon oxide, and it is possible to have a modification of the volume between surface coating 9 and stable 8 material. This modification of the dimensions is taken into account in defining the first and second areas in photoresist 5. Surface coating 9 is then made from a material that comes from stable material 8 after a transformation step. This embodiment enables the intrinsic properties of stable material 8 to be modified while at the same time keeping the advantages of direct definition of the surface coating by the radiation (speed, precision). The embodiments illustrated in FIGS. 9 and 10 can come from prior steps respectively illustrated in FIGS. 7 and 8.

Figure 11:
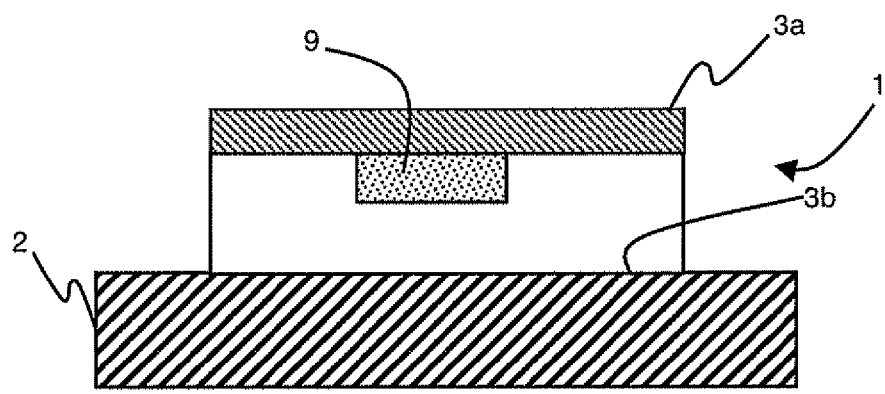
Figure 12:
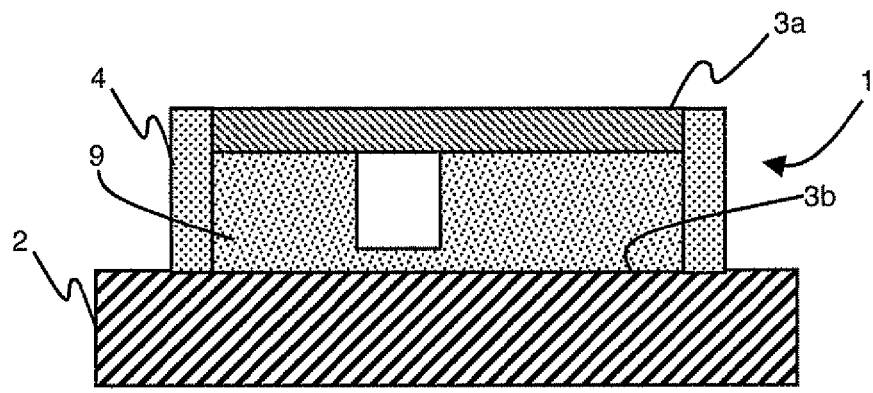

It is also conceivable, in another embodiment illustrated in FIGS. 11 and 12, to use the void area formed in cavity 1 after removal of sacrificial material 7 to perform delineation of surface coating 9. In this case, surface coating 9 is formed in the first area of sacrificial material 7 after removal of the sacrificial material, and surface coating 9 fills the volume left void. The surface coating is therefore controlled in its dimensions by means of the radiation via stable material 8 which acts as mold. This embodiment is particularly advantageous when it is impossible or difficult to obtain a photoresist presenting the required polarity and/or characteristics (optic, electric, etc.). The embodiments illustrated in FIGS. 11 and 12 can come from prior steps respectively illustrated in FIGS. 9 and 10.

In all cases, surface coating 9 is against one of main walls 3 and has a free surface. The free surface is at a distance from opposite main wall 3 and can be in contact with a fluid. The free surface is facing one of the main walls, but according to the shape of the surface coating, the free surface can also be facing a side wall. The radiation defining at least one area of sacrificial material 7, cavity 1 is partly covered by one area of surface coating 9 and at least a part of first main wall 3a and/or of second main wall 3b is free after removal of sacrificial material 7 or removal of stable material 8 delineating surface coating 9. In all cases, surface coating 9 does not cover all the walls of cavity 1.

Surface coating 9 is located in cavity 1 on one of the main walls 3 of the cavity, either the top main wall 3a or the bottom main wall 3b or both main walls 3. Surface coating 9 is delineated in cavity 1 by means of photoresist 5 and of the radiation modifying a part of photoresist 5 either directly or in complementary manner. The choice of surface coating delineation technique is made according to the polarity of the photoresist, to its functionality (required mechanical, optic, physicochemical and electrical characteristics), to the dimension required for the surface coating and to the radiation operating conditions.

In a particular embodiment, surface coating 9 can cover the whole of the inner surface of one of main walls 3 (FIGS. 9, 12, 14, 18 and 19) or only a specific area (FIGS. 11, 13 and 15 to 17). It is also possible for surface coating 9 to be present on the two opposite main walls 3 but only on a part of these walls. This difference in the scope and location of the surface coating arises from the exposed photoresist area and therefore from the volume of the portion of cavity subjected to radiation and/or from the absorption of this radiation by the cavity.

A part of the inner surface of cavity 1 is thereby covered by surface coating 9. Surface coating 9 is laterally delineated in positive or negative manner by means of the incident radiation with respect to the volume of exposed photoresist 5. This technique therefore enables the position and lateral dimensions of surface coating 9 to be defined perfectly in an area that is difficult to access and without modifying the physicochemical properties of first main wall 3a and second main wall 3b. To achieve good control of the electrical, mechanical, optic or physico-chemical properties in cavity 1, the shape of surface coating 9, and therefore its thickness or the variation of its thickness along its surface, also have to be controlled.

A first way of controlling the thickness of surface coating 9 is to control the thickness of photoresist 5 which will delineate the surface coating. In this case, all the photoresist 5 subjected to the radiation is exposed and the thickness variations when photoresist 5 is deposited are re-transcribed into the surface coating. This embodiment illustrated in FIG. 1 is particularly interesting if it is required to form two identical patterns facing one another on main walls 3 of cavity 1.

A second way of controlling the thickness of surface coating 9 is to control the radiation profile absorption in cavity 1. The thickness of surface coating 9 is defined within the thickness of photoresist 5 (FIGS. 5 and 6). The thickness of the future surface coating 9 corresponds to the first exposed thickness of photoresist 5 or to the complementary part of the exposed thickness. It is no longer absolutely necessary to work with a first main wall 3a that is transparent to radiation or considered as such. It is possible and even advantageous to work with a first main wall 3a that partially absorbs the radiation so as to avoid in certain cases forming a strip of photoresist 5 over the whole thickness of the cavity. It is also necessary to work with a photoresist 5 that absorbs the radiation partially. Photoresist 5 can fill the cavity as illustrated in FIG. 2 or it can leave a void volume as illustrated in FIG. 3 or a volume filled by a filling material 6 as illustrated in FIG. 4.

When the whole of the thickness of photoresist 5 is transformed in a volume of cavity 1, the thickness of the exposed material is controlled by means of the height of the cavity or the thickness of photoresist deposited. It is not the exposure step that performs dimensional control of surface coating 9. The thickness of transformed photoresist 5 is defined by means of cavity 1 and it then depends on the mechanical characteristics of the materials forming main walls 3 and on the formation method of cavity 1. Depending on the formation method or on the deposition conditions of photoresist 5, deformation of cavity 1 may take place thereby making the thickness of photoresist 5 vary between the center and the edges of cavity 1, whereas without photoresist the cavity presents parallel main walls. Once the photoresist has been exposed, cavity 1 is irremediably deformed. By deliberately leaving a void area on one of the main walls, dimensional control on the thickness can be performed precisely. This dimensional control can be performed depending on the cases on the height of the void volume or on the thickness of surface coating 9.

If, after sacrificial material 7 has been removed, cavity 1 is filled by at least one pillar which contacts the two opposite main walls 3, the pillar does not act as surface coating as it does not enable a part of the surface of cavity 1 to be functionalized. The pillar removes the two areas that act as contact for the latter with main walls 3 from the available surface.

By deliberately choosing radiation-absorbing materials to form photoresist 5 and possibly first main wall 3a, the thickness of photoresist 5 that is exposed and therefore the thickness of surface coating 9 can be controlled. According to the polarity of photoresist 5 used, the thickness of exposed photoresist 5 corresponds to the thickness of the surface coating or to the thickness of the void volume between the surface coating and the opposite wall. Whereas under conventional photolithography conditions it is sought to work with a photoresist that is as transparent as possible to the radiation used or to make absorption negligible, in the present case the radiation conditions, the materials chosen and the thicknesses used are associated to ensure that a part of the radiation energy does not reach second main wall 3b or even a part of the photoresist more or less close to this second main wall 3b.

Although all the photoresist 5 can be subjected to the radiation, only the volume of photoresist 5 that receives a greater energy than the threshold exposure energy of photoresist 5 is transformed. An area not subjected to incident radiation or subjected to a radiation that is not powerful enough is therefore not considered as being exposed and therefore not transformed. The threshold exposure energy which conditions the property change of photoresist 5 is modulated by means of the photoresist used and also by means of the operating conditions when the photoresist is formed, typically by means of the coating parameters of photoresist 5, for example the temperature of its pre-exposure anneal.

By judiciously choosing the radiation energy, the absorption profile as it passes through the materials and the threshold exposure energy, the thickness of surface coating 9 can be defined with respect to the height of cavity 1. The absorption profile is defined from the materials passed through and from the thicknesses of these materials. The absorption profile gives the proportion of radiation available with respect to the initial energy on output from the radiation source or on the outer surface of the structure, on passage of the radiation used (according to the thickness).

In general manner, when a predefined material is irradiated by means of a known electromagnetic radiation, the proportion of incident radiation that passes through the material is given by the following relation:

$$T = e^{\left(\frac{-4\pi \cdot k}{\lambda} \cdot z\right)},$$

in which
T is the transmission coefficient of the material passed through at the required wavelength,
$\lambda$ is the electromagnetic radiation wavelength,
k is the attenuation coefficient of the irradiated material,
z is the thickness of the irradiated material.

By means of the above equation, it is possible to calculate abacuses representing for example the variation of the transmission coefficient at a predefined wavelength for different thicknesses of a predefined material. Such abacuses can be determined for example by means of the XOP software.

For electronic radiation, the SKELETON software from the Synopsis Corporation or the Casino software from the University of Sherbrooke in Quebec can be used.

In calculating the global transmission coefficient of a structure, the attenuation generated by all the materials through which the electromagnetic or electronic radiation passes has to be taken into account. On account of this, to achieve reliable abacuses of radiation transmitted to the first photoresist, at least the thickness of first main wall 3a, the thickness of photoresist 5 and the nature of the materials that form first main wall 3a and photoresist 5 have to be taken into account.

The exposure energy of photoresist 5, the initial radiation energy and the attenuation sought for within the structure are the parameters to be modulated to obtain the required exposed photoresist profile. By means of the abacuses, the correlation that exists between the different operating conditions set out above can be defined simply.

Once certain parameters have been imposed, the conditions on the other parameters to obtain the required surface coating can be defined by means of the abacuses. When first main wall 3a presents a variable thickness, and therefore an attenuation which varies over the whole of the first main wall, the surface coating also presents a variable thickness. If on the other hand first main wall 3a presents a constant absorption over the whole of its surface, deformation of first main wall 3a does not have any repercussions on the thickness of the exposed area. If the exposed area forms the future surface coating 9, the latter will have a constant thickness which will follow the deformation of the first main wall.

Furthermore, the attenuation coefficient of each of the materials being variable, it is also advantageous to also modulate the incident radiation wavelength so as to have the largest choice in the possible materials and thicknesses for first main wall 3a and photoresist 5.

Figure 13:
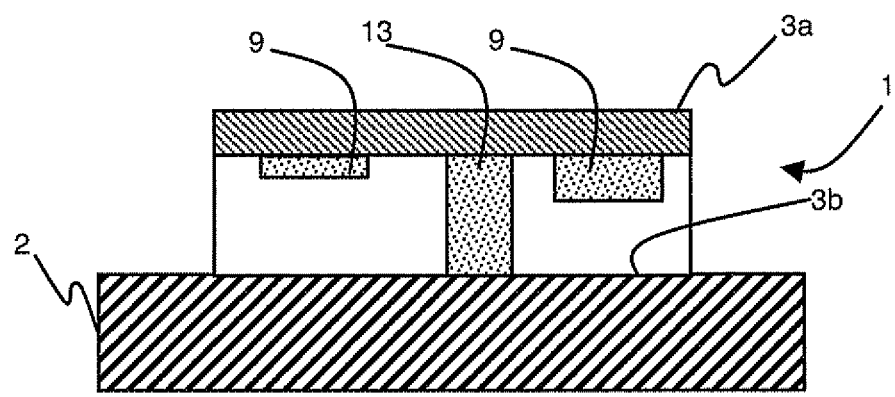

However, in an alternative embodiment illustrated in FIG. 13, it is possible for certain volumes of photoresist 5 joining the two main walls 3 in the direction of radiation to be completely exposed or not exposed so as to form a volume of stable material 8, a pillar 13 that joins the two opposite main walls 3. These material volumes are for example made from the same material as surface coating 9, but as explained in the foregoing, they do not act as surface coating 9. For example purposes, these volumes of photoresist 5 can be used to improve the mechanical characteristics of cavity 1, to define sub-cavities within cavity 1 or to limit the effective surface of cavity 1.

The electronic radiation is a localized radiation which is typically obtained by means of an electron gun. The movement of the electronic radiation enables the exposed area and therefore the lateral dimensions of the surface coating area to be delineated laterally. Delineation of the surface coating area is achieved as explained in the foregoing, by the energy of the electron gun, the thickness of photoresist 5 and/or absorption in cavity 1.

The electromagnetic radiation presents a wavelength comprised between 12.5 and 15 nm, i.e. a radiation in the extreme ultraviolet. The extreme ultraviolet radiation is not localized. In conventional manner, the ultraviolet radiation is emitted from a source and passes through an operating conditions control device and the ultraviolet radiation floods a more or less large surface. In conventional manner, the extreme ultraviolet radiation can be coupled with a mask whereby the areas to be exposed can be defined. The mask presents areas that are opaque to the radiation and transparent or partially transparent areas. The transparent areas laterally delineate the areas to be exposed. However, depending on the embodiments, this mask can be optional. The mask enables diffused radiation to be transformed into localized radiation.

The operating conditions of the radiation applied to cavity 1 are defined such as to ensure formation of the patterns with the selected resolution. In certain cases, it is difficult to obtain good control of the lateral dimensions and perfect mastery of the absorption profile of the radiation.

Figure 14:
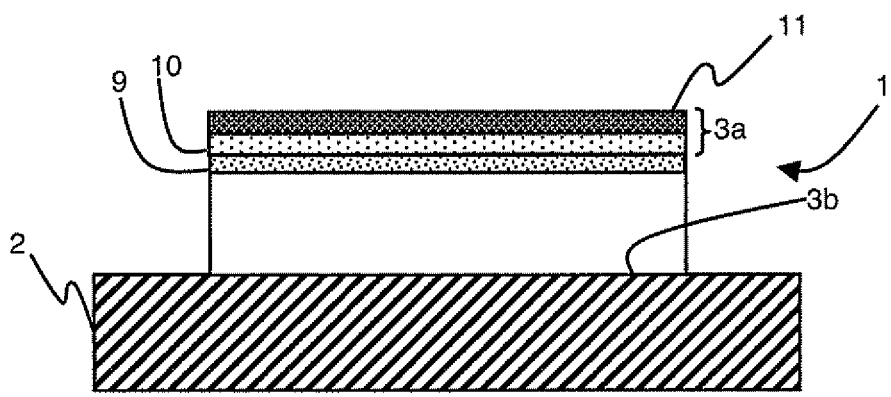

As illustrated in FIG. 14, in cases where the material forming first main wall 3a, i.e. active layer 10, is too transparent to obtain the required profile of surface coating 9, a masking material 11 is formed in addition. First main wall 3a then comprises an active layer 10 and a masking layer 11.

The material of masking layer 11 and the thickness of the latter enable absorption of the radiation to be modulated and therefore define the depth down to which exposure takes place within photoresist 5.

Figure 15:
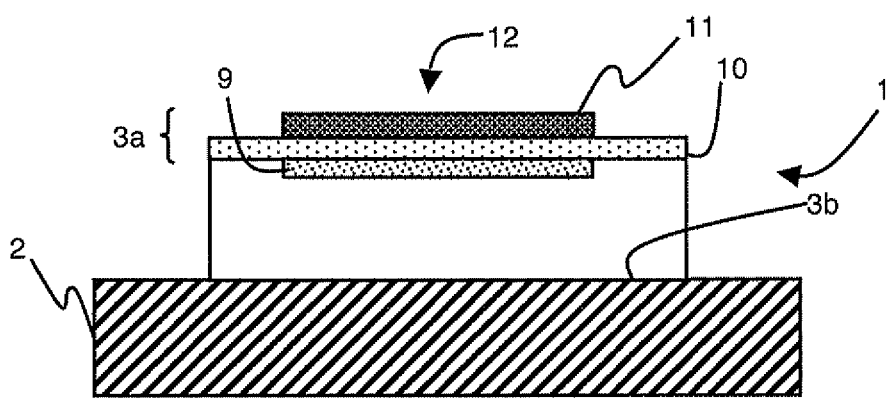
Figure 16:
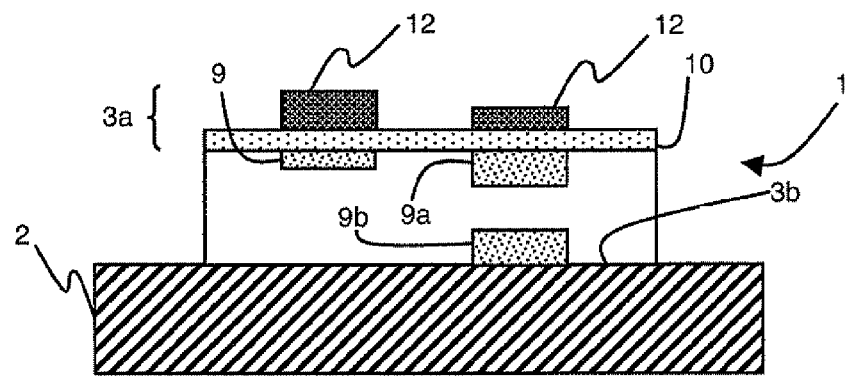
Figure 17:
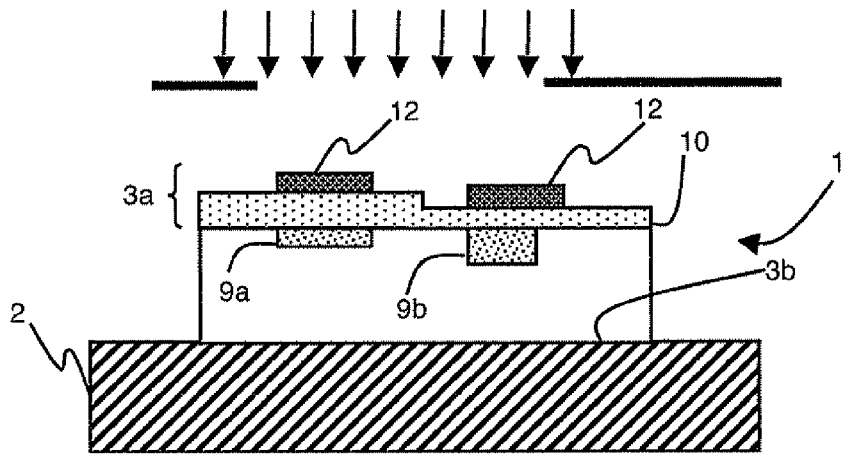

As illustrated in FIGS. 15 and 16, by patterning masking layer 11 to form an absorption mask 12, it is possible to form a first main wall 3a that presents a required absorption profile, a particular absorption profile. Considering that absorption in photoresist 5 and absorption in active layer 10 are homogeneous in their volumes, definition of the absorption mask in its thicknesses and its constituent enables the thickness of future surface coating 9 to be controlled. The shape of surface coating 9 only depends on the absorption profile of absorption mask 12. Absorption mask 12 can be of any shape and be formed by one or more patterns arranged on one and the same first main wall 3a (FIG. 16).

In this way by using an absorption mask 12 which presents a predefined pattern or a masking layer 11, it is possible to obtain a first main wall 3a that presents a particular attenuation profile. If the photoresist is homogeneous in its volume, therefore if it presents a constant attenuation coefficient, the attenuation profile of first main wall 3a is reflected in photoresist 5, the first areas of sacrificial material and the second areas of stable material 8 reproducing this mask.

It is also advantageous to use a masking layer 11 which presents an attenuation coefficient that is identical or close to that of active layer 10. Formation of a masking layer having a flat free surface covering the patterned surface of active layer 10 at least partially erases the absorption difference in active layer 10. The exposed area of the photoresist then presents a substantially flat interface with the non-exposed area. An identical result can be achieved using a photoresist which has an identical absorption coefficient to that of first main wall 3a.

In a first embodiment (FIG. 1), the thickness of surface coating 9 is defined by means of the thickness of photoresist 5. The thickness of photoresist deposited is small and leaves a void volume in cavity 1. The incident radiation modifies the properties of photoresist 5 over the whole thickness thereof. The incident radiation passes through photoresist film 5 arranged on first main wall 3a and the film then presents sacrificial material areas 7 and stable material areas 8 over the whole thickness of photoresist 5.

In this first embodiment, the thicknesses are small and there is little absorption of the radiation by the materials passed through. The radiation then reaches photoresist film 5 arranged on second main wall 3b and defines sacrificial material areas 7 and stable material areas 8 over the whole thickness of photoresist 5.

Two surface coating areas 9 are arranged symmetrically facing one another on first 3a and second 3b main walls of cavity 1 and correspond to the path of the radiation in cavity 1. In this case, the radiation energy is sufficient to expose the two distinct photoresist films 5 on the radiation path (areas 9a and 9b in FIG. 16). Photoresist film 5 has a first thickness that has been completely exposed at the level of first main wall 3a. A second area of the same thickness is exposed in the photoresist arranged against second main wall 3b. In this way, exposed photoresist film 5 form two surface coating areas of the same thickness. The thickness of deposited photoresist is less than half the height of cavity 1 so as to leave a void area in the wall.

In certain cases, there is a plane of symmetry in the cavity, this plane of symmetry being perpendicular to the direction of propagation of the incident radiation. In practical manner, if the main walls are flat and parallel and if the direction of propagation of the radiation is perpendicular to first main wall 3a, the plane of symmetry is parallel to main walls 3 and is arranged equidistant from the main walls. Exposure of photoresist 5 can be performed by means of a localized source, by means of a diffuse source which passes through a mask, and/or by means of an absorption mask 12 formed in first main wall is 3a.

In a second embodiment (FIG. 2), photoresist 5 is deposited on main walls 3 of cavity 1 and does not fill cavity. The radiation energy is insufficient to expose the whole of photoresist 5 located on its passage. There is then a difference between first 3a and second 3b main walls. Second main wall 3b presents an even surface, a free surface or full covering by surface coating 9 (FIG. 12). First main wall 3a can present a patterned surface, a surface presenting both void areas and surface coating areas, or an even surface. If second main wall 3b is free, first main wall 3a is either completely or partially covered by surface coating 9 by at least one pattern. If second main wall 3b is completely covered by surface coating 9, first main wall 3a is either free or partially covered by surface coating 9. If second main wall 3b is covered by stable material 8, it can comprise areas of variable thicknesses if it was partially exposed by the radiation following complete exposure of a portion of the photoresist against first main wall 3a.

This embodiment corresponds to several cases. In a first alternative embodiment, the remaining volume of cavity 1 is filled by a filling material 6 which absorbs the incident radiation (FIG. 4). The operating conditions of the radiation used are defined for the radiation to pass through first main wall 3a and expose photoresist 5 that is deposited on this first main wall 3a. The incident radiation is then absorbed by filling material 6 to prevent any parasitic exposure of the photoresist deposited on second main wall 3b. Filling material 6 and the incident radiation operating conditions are therefore chosen such as to prevent the incident radiation from reaching photoresist 5 arranged against second main wall 3b. Second main wall 3b is therefore completely covered by surface coating or completely free (FIGS. 12, 14, 15 and 17 to 19).

In a second alternative embodiment, the thickness of photoresist 5 and the incident radiation operating conditions are defined for the radiation not to pass through photoresist 5 arranged against first main wall 3a (FIGS. 3 and 4). Only a part of the thickness of photoresist 5 arranged on first main wall 3a is therefore exposed and photoresist 5 localized on second main wall 3b is not exposed. According to the polarity of photoresist 5, it is therefore possible to define a surface coating 9 having a precise thickness that is smaller than the thickness of photoresist 5 when deposited in the cavity. A void volume corresponding to the exposed volume can also be defined in the layer of photoresist 5, if the latter volume is transformed into sacrificial material. This void volume is covered by the remaining part of photoresist film 5. The second main wall is therefore completely covered by the surface coating or completely free (FIGS. 12, 14, 15 and 17 to 19).

In a third alternative embodiment, photoresist 5 or a part of photoresist 5 arranged against first main wall 3a is completely exposed, but exposure stops in the volume of photoresist arranged against second main wall 3b.

In the embodiments that follow, photoresist 5 fills the volume of cavity 1. As in the previous embodiments, the future surface coating 9 can be defined three-dimensionally.

In a third embodiment illustrated in FIGS. 14 to 19, which can be combined with the second embodiment, first main wall 3a comprises an active layer 10 and a masking layer 11. Active layer 10 is a permanent layer, i.e. the layer that defines the surface of the first main wall and therefore the surface of cavity 1. Masking layer 11 is chosen made from a material that advantageously presents a higher or identical attenuation coefficient to that of active layer 10. Masking layer 11 can be a sacrificial layer. Masking layer 11 can be a layer that covers the whole of active layer 10 and therefore the whole of first main wall 3a.

In a fourth embodiment illustrated in FIGS. 13 and 16 to 19, which can be combined with the second and third embodiments, first main wall 3a presents a variable absorption profile. First main wall 3a does not have a constant absorption over the whole of its surface. This absorption difference can originate from modulation of the thickness on the surface (FIGS. 16 to 19) and/or from modulation of the materials used (FIG. 13).

As illustrated in FIGS. 16 to 19, active layer 10 and/or masking layer 11 can present thickness variations. Active layer 10 and/or masking layer 11 can present differences of distributions in the materials used. Masking layer 11 can be patterned so as to form an absorption mask 12 (FIGS. 15 to 18). In the latter case, first main wall 3a presents an attenuation that varies according to the position on first main wall 3a.

Figure 18:
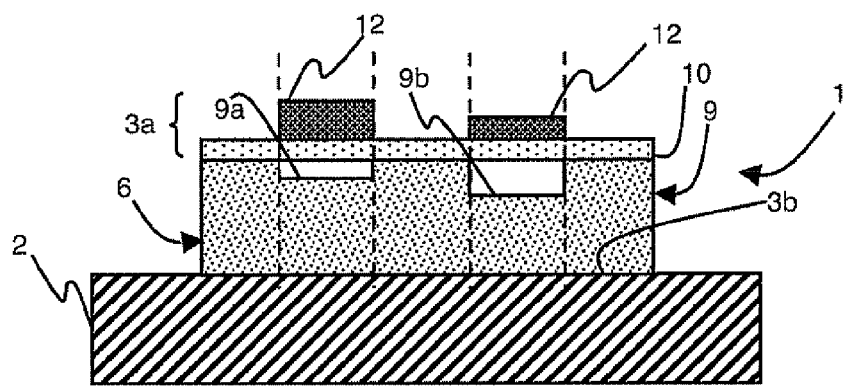

For example purposes illustrated in FIGS. 16 and 18, if first main wall 3a is composed of a homogeneous active layer 10 overlaid by an absorption mask 12 formed by two lines of masking material, photoresist 5 can present different shapes after exposure and removal of sacrificial material 7. In a first example (FIG. 16), first main wall 3a is covered by two surface coating areas 9, and second main wall 3b comprises surface coating area 9b. In a second example (FIG. 18), second main wall 3b is completely covered by surface coating 9 and first main wall 3a presents two areas not covered by surface coating 9 and a pillar 13. In the latter example, stable material 8 against first main wall 3a coincides with stable material 8 against second main wall 3b to form pillars 13. Surface coating 9 is formed by the free surface of stable material 8 that is facing and at a distance from the opposite main wall, here first main wall 3a.

Figure 19:
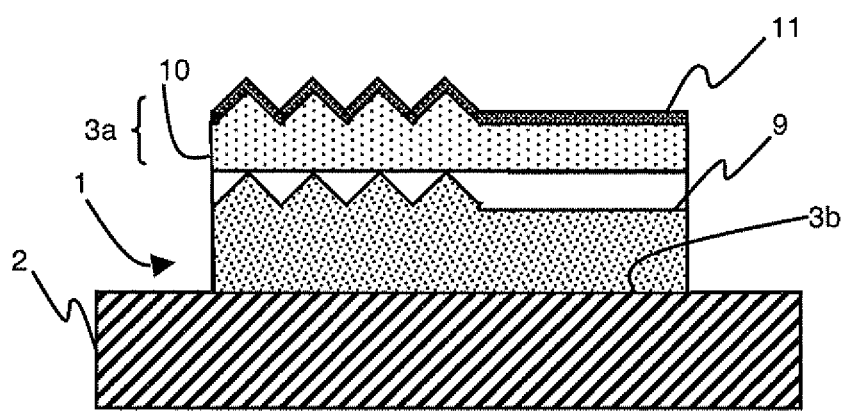

In another example illustrated in FIG. 19, first main wall 3a presents an attenuation profile of pyramidal shape. This profile can be obtained for example by means of an active layer 10 presenting a pyramidal shape covered by a masking layer 11 of constant thickness. The interface between first sacrificial material areas 7 and second stable material areas 8 also reproduces the pattern of pyramidal shape.

By imposing on first main wall 3a a variable attenuation profile according to the position on the first main wall, it is possible to form a surface coating 9 having a predefined variable thickness.

The three-dimensional shape of surface coating 9 in cavity 1 is thus directly linked to the attenuation profile of the first main wall, typically it is linked to the shape of absorption mask 12 if absorption is homogeneous in photoresist 5. It is also possible to couple the absorption profile of absorption mask 12 with that of active layer 10.

In an alternative embodiment, photoresist 5 is exposed by the electronic radiation or by the extreme ultraviolet radiation through a mask that does not reproduce the pattern of the absorption mask. Under these conditions, the shape of the surface coating corresponds to the intersection between the pattern defined by the radiation (directly by the electron beam or through a mask) and the shape of the absorption mask (pattern 9b of FIG. 17).

The dimensions of surface coating 9 are controlled three-dimensionally. The radiation that exposes photoresist 5 delineates the photoresist laterally. Control of the thickness can be performed in two different manners. In a first case, the radiation exposes the whole of the thickness of the photoresist. In this case, the thickness of the surface radiation is controlled by means of the deposited photoresist thickness. In a second case, the radiation also defines the thickness of photoresist 5 that will subsequently delineate surface coating 9. The radiation operating conditions and the materials forming first main wall 3a and the photoresist are chosen such that the radiation is partially absorbed in the top wall and the photoresist and such that the difference between the radiation energy and the exposure threshold is zero at the required thickness of the future surface coating 9. In this way, the exposure radiation energy is absorbed gradually as the materials are passed through. The first part of photoresist 5 is therefore modified by the radiation as it still has sufficient energy, and when the radiation energy becomes lower than or equal to the threshold exposure energy, the second part of the photoresist is not modified. Superposition of a first sacrificial material area and a second surface coating area then occurs in the photoresist. According to the polarity of photoresist 5, first sacrificial material area 7 can be above or below the second surface coating area.

In simple manner, by forming an absorption mask 12 having controlled three-dimensional dimensions on the outer surface of first main wall 3a, this shape can be reproduced inside cavity 1 in photoresist 5 by means of movement of the interface between the exposed area and the non-exposed area.

By forming a surface coating 9 in the cavity in localized manner, it becomes possible to reduce the effective thickness between the two main walls 3. For example, if the distance between the two main walls 3 is too large, it is possible to reduce this thickness by forming a surface coating of controlled thickness. According to the polarity of photoresist 5 and to the method used, the surface coating can then be localized on first main wall 3a and/or on second main wall 3b. For example if first main wall 3a is a mobile element of a resonator, it is possible to form a surface coating on this first main wall 3a. This mobile element will therefore see its mass modified which will result in a modification of its resonance frequency. It is then possible to correct a divergence in the production process once the resonator has been formed.

In the cases where first main wall 3a is a mobile element and is liable to stick to second main wall 3b, it is interesting to form an area presenting specific surface properties which prevent two walls from sticking to one another. Once the mobile element has been formed or once cavity 1 has been formed, it suffices to form photoresist 5 on main walls 3 of cavity 1 and to expose this photoresist 5. Depending on the operating conditions used, one or two surface coating areas 9 can form which prevent any nuisance sticking of the mobile element. In so far as the mobile element is formed, it is easier to delineate surface coating area 9 precisely. It is then no longer necessary to take account of the variations of the production process as the final structure is known. Furthermore, the method being very simple to implement, it can easily be integrated in the construction scheme of the device to repair a deficient structure or to specialize a device with respect to another.

In the case where the distance between the main walls has to be perfectly controlled, it is interesting to form surface coating layer 9 once the structure has been made. As before, the structure being formed, possible variations of the production process no longer need to be taken into account. This embodiment is particularly interesting when a particular thickness is to be defined between the two main walls 3.

In the case where the cavity comprises a pair of facing surface coating areas 9a and 9b, as illustrated in FIG. 18, these two areas can define an area presenting a particular wettability and form for example a liquid conduction channel.

In the case where surface coating 9 presents particular optic properties compared with the main wall on which it is formed, it is interesting to form an optic waveguide. This embodiment is particularly advantageous as the formation process of the cavity takes place prior to the formation process of the waveguide and degradation of the properties of the materials constituting the waveguide is avoided.

In a fifth embodiment which can be combined with the previous embodiments, masking layer 11 is made from a second photoresist which is reactive to electronic or electromagnetic radiation of wavelength comprised between 12.5 nm and 15 nm or to another radiation.

Masking layer 11 can be exposed before photoresist 5 in order to define absorption mask 12 or masking layer 11 is exposed at the same time as photoresist 5. According to the polarity of the photoresists used, it is possible to form two sacrificial areas or to delineate two surface coating areas 9 or a surface coating area 9 and a sacrificial area 7.

When masking layer 11 is exposed before photoresist 5, absorption mask 12 formed by second photoresist is used in the same way as before.

For example purposes, this configuration is particularly advantageous for fabricating a dual-gate transistor the channel of which is formed by active layer 10. In this case, the gates of this transistor are located on each side of the channel, i.e. of active layer 10.

The two photoresist layers 5 are then subjected, through an exposure mask, to an electromagnetic radiation having a predefined wavelength comprised between 12.5 and 15 nm and preferably equal to 13.5 nm. In this way, by means of the mask, all the patterns of the chip are defined in one go, when the reaction of the photoresist layers with the electromagnetic radiation takes place.

The nature and thickness of the second photoresist layer and of first main wall 3a are chosen such as to let a sufficient quantity of photons pass through to photoresist 5. For the two exposed areas to be defined respectively in each photoresist on each side of first main wall 3a and with the same lateral dimensions, transmission of the electromagnetic radiation through the second photoresist layer and semi-conductor material film 1 has to be at least equal to 50%, preferably at least equal to 80%.

For example purposes, if first main wall 3a is made from semi-conductor material, it is made from silicon or silicon base, for example SiC or a SiGe alloy. The electromagnetic radiation wavelength is advantageously chosen equal to 13.5 nm. First main wall 3a then in fact presents an attenuation coefficient k which is very low at the chosen wavelength. The thickness of first main wall 3a does however have to be smaller than a predetermined critical thickness to ensure passage of the radiation with sufficient energy to make photoresist 5 react. The critical thickness can be established for example from the XOP software taking into account the attenuation coefficient of the materials through which the electromagnetic radiation has already passed and the absorption in the photoresist.

In another embodiment, photoresist 5 has a reverse polarity to that of masking layer 11 which enables a void area to be formed in the cavity at the level of second main wall 3b. If the photoresist has dielectric properties close to or better than those of silicon oxide, the structure obtained is of substrate on insulator type with a buried dielectric of variable thickness. If absorption mask 12 acts as gate or serves the purpose of delineating the gate of a transistor, there is specifically and in self-aligned manner under the gate a buried dielectric which presents different properties from the buried dielectric located at the level of the source and drain areas.

Advantageously, if film 1 is made from silicon, its thickness is comprised between 5 and 25 nm, and in even more advantageous manner the thickness is about 10 nm.

In general manner, first main wall 3a is made from semi-conductor material and advantageously from silicon or a silicon-base material such as SiC or SiGe alloys. First main wall 3a can also be made from germanium or from a semi-conductor alloy of III-V or II-VI type, such as for example AsGA, InP, CdTe, ZnTe. The first main wall can also be made from metal or from an insulating material. Depending on the properties of first main wall 3a, one of the two types of radiation may not be suitable.

In a particular embodiment, the thickness of the cavity is typically equal to 20 nm, the thickness of film 1 is about 10 nm and the thickness of the second photoresist film is less than or equal to 50 nm.

The photoresists are developed for example with a solution with a TMAH (TetraMethyl Ammonium Hydroxide) base.

In these embodiments, it is possible to form a plurality of surface coating areas 9 on a main wall 3 or a plurality of pairs of surface coating areas. The pairs of areas are formed by two surface coating areas 9 which have identical lateral dimensions and which are self-aligned in cavity 1 (FIG. 16). The surface coating areas are formed by a plurality of exposures or by a single exposure step comprising a mask having a plurality of transparent areas.

In a sixth embodiment which can apply to the foregoing embodiments, the cavity comprises a plurality of different surface coating areas 9. The different surface coatings 9 are formed successively. A first photoresist 5 associated with a first surface coating is thus deposited in cavity 1. This first photoresist 5 is exposed to form a first sacrificial material 7 and to delineate a first surface coating. Once first sacrificial material 7 has been removed and the first surface coating has been formed, a second photoresist is deposited in the cavity and exposed to form a second sacrificial material and to define a second surface coating. In the same way, it becomes possible to successively form different surface coatings 9 each associated with an area or with a pair of areas. The different surface coatings 9 can present a variable thickness from one another within cavity 1.

Cavity 1 is thus partially covered by at least one surface coating area 9. Photoresist 5 that delineates surface coating area 9 is chosen according to physico-chemical, optic, and mechanical particularities and to its ability to react to incident radiation.

Photoresist 5 is for example an organic photoresist which reacts to the radiation used (electronic or electromagnetic), but it can also be a non-organic photoresist. The photoresist can also be a self-assembled monolayer (SAM) which can present interesting surface properties from an electrical standpoint.

Photoresist 5 is advantageously made from HSQ (hydrogen silsesquioxane) which can be annealed to subsequently form an oxide.

The surface coating material can also be a catalyst material for growth of nanotubes or nanowires or an electrically conductive material which enables subsequent growth by electrochemical deposition.

it is also conceivable to fill the cavity once the surface coating has been formed. Cavity can for example be formed by materials presenting different dielectric properties (two insulating materials or an insulating material and an electrically conductive material) which can enable the field lines to be channelled in the cavity.

The invention claimed is:

1. A method for forming a surface coating in a cavity comprising:
    Providing the cavity with opposite first and second main walls and a photoresist covering the first and second main walls of the cavity,
    Performing exposure of a first thickness of the photoresist, through the first main wall, by a radiation such as to form in the photoresist a first zone of sacrificial material and a second zone of different nature material,
    removing the sacrificial material and forming the surface coating having an area delimited by one of the first and second zone against one of the main walls, said surface coating covering one of the main walls and having an opposite free surface.

2. The method according to claim 1, wherein the first and second areas are superposed along radiation propagation.

3. The method according to claim 1, wherein the radiation is of electromagnetic type with a wavelength comprised between 12.5 nm and 15 nm or of electronic type.

4. The method according to claim 1, wherein the first main wall comprises an active layer and a sacrificial masking layer.

5. The method according to claim 4, wherein the masking layer is patterned to form an absorption mask, the first main wall presenting a variable radiation absorption profile.

6. The method according to claim 4, wherein the masking layer is a photoresist sensitive to said radiation.

7. The method according to claim 1, wherein the surface coating presents a variable thickness.

8. The method according to claim 1, wherein the photoresist fills the cavity.

9. The method according to claim 1, wherein a filling material absorbing the radiation is arranged in the cavity.

10. The method according to claim 1, wherein the photoresist forms the surface coating.

11. The method according to claim 1, wherein the photoresist is subjected to a heat treatment to form the surface coating.

12. A method for forming a surface coating in a cavity comprising
    providing the cavity with opposite first and second main walls and a photoresist covering the first and second main walls of the cavity,
    exposing, through the first main wall, the photoresist to a radiation transforming a first thickness of the photoresist such as to form in the photoresist a first zone of sacrificial material and a second zone of different nature material, the first thickness being smaller than a distance between first and second main walls along radiation propagation,
    removing the sacrificial material, one of the main walls being at least partially covered by a pad made of the different nature material, said pad having an interface with one of the main walls and an opposite a free surface,
    forming the surface coating against one of the main walls in one of the first and second areas, said first and second areas defining the surface coating.

* * * * *